United States Patent [19]

Kawakami et al.

[11] Patent Number: 5,008,703
[45] Date of Patent: Apr. 16, 1991

[54] EXPOSURE APPARATUS AND CONTROL OF THE SAME

[75] Inventors: Eigo Kawakami, Ebina; Kunitaka Ozawa, Isehara; Koji Uda, Yokohama; Isamu Shimoda, Zama; Shunichi Uzawa, Tokyo, all of Japan

[73] Assignee: Canon Kabushiki Kaisha, Tokyo, Japan

[21] Appl. No.: 407,434

[22] Filed: Sep. 6, 1989

[30] Foreign Application Priority Data

Sep. 9, 1988 [JP] Japan .................. 63-224711

[51] Int. Cl.⁵ .............................................. G03B 27/42
[52] U.S. Cl. ...................................................... 355/53
[58] Field of Search .................. 355/43, 53, 54, 86, 355/77, 95; 364/525; 356/400, 401

[56] References Cited

U.S. PATENT DOCUMENTS 4,595,282  6/1986  Takahashi ........................ 355/53
4,653,903  3/1987  Torigoe et al. .................. 355/53
4,669,867  6/1987  Uda et al. ........................ 355/53
4,749,867  6/1988  Matsushita et al. .......... 250/422.1

FOREIGN PATENT DOCUMENTS 3428408  2/1985  Fed. Rep. of Germany .
63-70436  3/1988  Japan .
8600427  1/1986  PCT Int'l Appl. .

Primary Examiner—Michael L. Gellner
Assistant Examiner—D. Rutledge

[57] ABSTRACT

Exposure apparatus and control of the same, for exposing a semiconductor wafer to a mask with a predetermined radiation energy, for manufacture of semiconductor devices, is disclosed. During a time period in which the mask-to-wafer alignment or the exposure of the wafer to the mask is made, the operation of any other driving device that has no participation in the aligning operation or the exposure operation, is prohibited. This ensures high-precision pattern printing.

9 Claims, 12 Drawing Sheets

EXPOSURE APPARATUS AND CONTROL OF THE SAME

FIELD OF THE INVENTION AND RELATED ART

This invention relates to an exposure apparatus and control of the same, for lithographically transferring a pattern formed on an original (such as a mask or reticle, for example) to a radiation-sensitive workpiece (such as a wafer, for example) by use of the radiation beam.

In step-and-repeat type exposure apparatuses, each being called a "stepper", the area of exposure (shot area) for which a wafer can be exposed by one exposure is small. Therefore, each time the alignment and exposure of one shot area on the wafer to the mask is accomplished, a wafer stage holding the wafer thereon by attraction is moved stepwise one-dimensionally or two-dimensionally, and, in this manner, the exposure of the whole surface of the wafer is executed.

SUMMARY OF THE INVENTION

In the field of such exposure apparatuses, with further miniaturization of semiconductor devices such as very large scaled integrated circuits (VLSIs), enhancement of precision of the mask-to-wafer alignment results in an important technical problem. One of the bars to enhancement of the alignment accuracy is the effect of mechanical external force. Such mechanical external force during the alignment or exposure operation is transmitted to a wafer stage in the form of vibration, resulting in an alignment error or production of defective chips.

Particularly, when the stepper is used in "in-line" manner, during a time period in which the step-and-repeat exposures are made to one wafer, another wafer having been exposed is conveyed to a collecting carrier while, on the other hand, an unexposed wafer is conveyed from a supplying carrier and an operation, called "orientation flat detection", for aligning an orientation flat of the supplied wafer in a predetermined direction is made to the supplied wafer. Therefore, it is necessary to structure the main assembly of the stepper or the wafer conveying mechanism so as to prevent transmission of vibration to the wafer stage during conveyance of wafers or orientation flat detection.

The present invention aims to solve the problem in an exposure apparatus that mechanical external force is transmitted to a mask or wafer at the time of alignment or exposure of the same, resulting in an alignment error or production of defective chips due to vibration during the exposure, and also to provide a method of control of the exposure apparatus which is effective to reduce the burden to be applied to mechanical designing, particularly with respect to vibration prevention.

In accordance with an aspect of the present invention, an exposure apparatus is controlled so that, at the time of alignment or exposure, the operation of any driving device which does not participate in the alignment or exposure operation is prohibited or, alternatively, the servo characteristic of that driving device is modified to such an extent that produced vibration can be disregarded. Accordingly, with the present invention, no vibration occurs during the alignment or exposure, or, if it is produced, it does not influence the alignment and exposure.

These and other objects, features and advantages of the present invention will become more apparent upon consideration of the following description of the preferred embodiments of the present invention taken in conjunction with the accompanying drawings.

DESCRIPTION OF THE PREFERRED EMBODIMENTS

Figure 1:
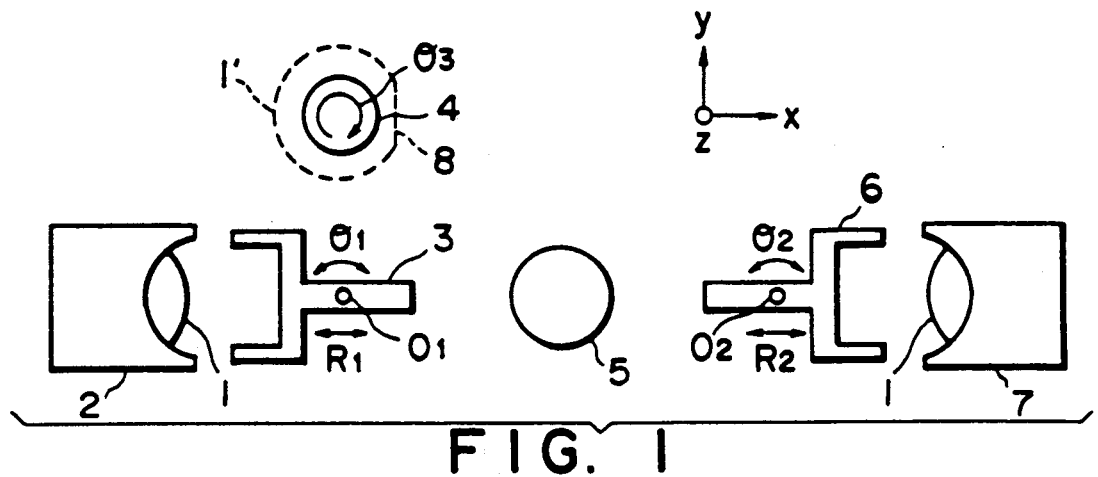
FIG. 1 is a top plan view schematically showing a major part of an exposure apparatus according to one embodiment of the present invention.

FIG. 1 is a top plan view of a major part of an exposure apparatus to which the present invention is applicable. In FIG. 1, denoted at 1 and 1' are wafers; at 2 is a wafer supply carrier; and at 3 is a supplying hand which is operable to convey a wafer 1 from the supply carrier 2 to an orientation flat detecting table 4, or from the table 4 to a wafer stage 5. Denoted at 6 is a collecting hand which is operable to convey an exposed wafer from the wafer stage 5 to a wafer collection carrier 7.

Figure 2:
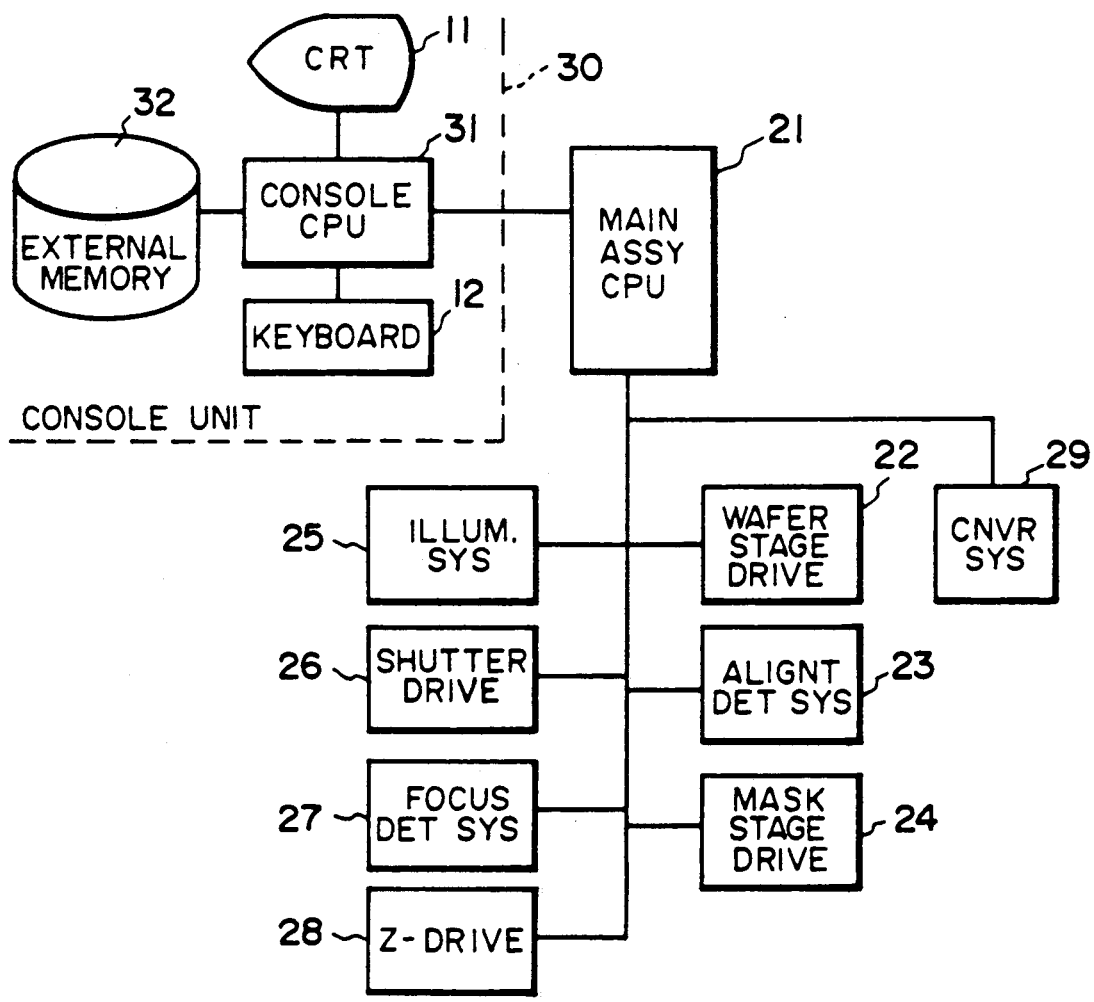
FIG. 2 is a block diagram of an electric circuit configuration of an exposure apparatus according to one embodiment of the present invention.

FIG. 2 is a block diagram showing an electric circuit configuration of an exposure apparatus to which the present invention is applicable. In FIG. 2, denoted at 21 is a main CPU (central processing unit) for controlling the exposure apparatus as a whole, which comprises a microcomputer or minicomputer, for example. Denoted at 22 is a wafer stage driving device; at 23 is an alignment detecting system; at 24 is a mask stage driving device; at 25 is an illumination system; at 26 is a shutter driving device; at 27 is a focus detecting system; at 28 is a Z-axis driving device; and at 29 is a conveying system for a mask or wafer, these components being controlled by the main CPU. Also, denoted at 30 is a console unit which is adapted to supply, to the main CPU 21, various instructions or parameters related to the operation of the exposure apparatus. Denoted at 31 is a console CPU; at 32 is an external memory for storing therein parameters, for example; at 11 is a monitor receiver (console CRT) of the console unit; and at 12 is a keyboard through which instructions can be applied to the apparatus or parameters can be specified.

Figure 3:
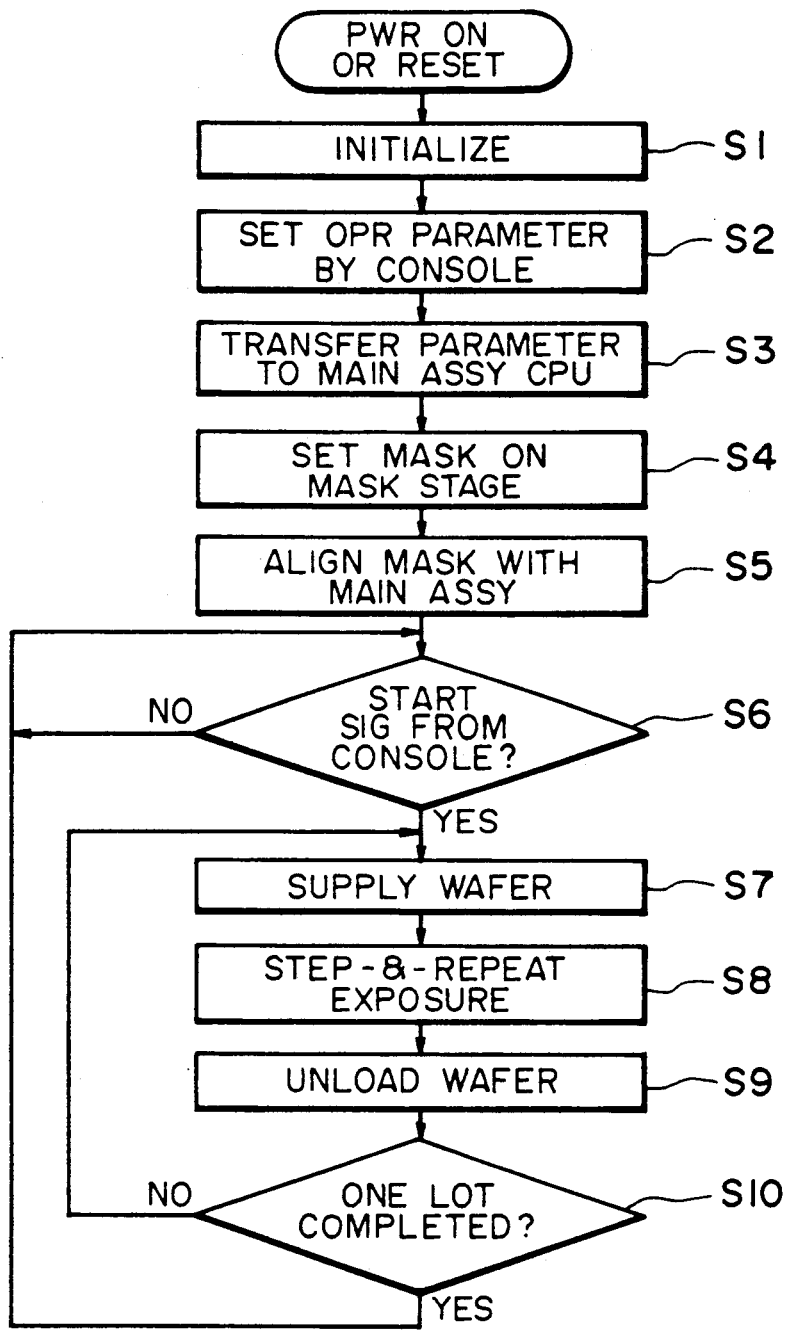
FIG. 3 is a flow chart illustrating a general operation of an exposure apparatus according to one embodiment of the present invention.

FIG. 3 is a flow chart generally showing the operation to be made in the exposure apparatus described above.

Referring to FIGS. 1–3, first, when the apparatus is powered, various portions of the exposure apparatus, as denoted at 21–29, as well as the console unit 30 are initialized (Step S1). Subsequently, through the keyboard 12 of the console unit 30, operation parameters are specified (Step S2). The specified parameters are transferred to the main CPU 21 (Step S3). Then, in response to an instruction signal supplied from the main CPU 21, the conveying system 29 conveys a designated mask to a mask stage (not shown) and places the same on the stage (Step S4). By means of the mask stage driving system 24 and the alignment detecting system 23, the thus introduced mask is positioned at a predetermined site in the major assembly of the exposure apparatus (Step S5). Thus, the apparatus is prepared, waiting for a process start command from the console unit 30 (Step S6). If, in this state, the start command is inputted from the console keyboard, it is transmitted to the main CPU. In response, the main CPU 21 signals an instruction to the conveying system 29 to cause the same to extract a wafer 1 from the wafer supply carrier 2, to execute the orientation flat detection and to place the wafer on the wafer stage 5. By this, the wafer 1 is supplied to the wafer stage 5. More specifically, under the influence of the motion of the supply hand 3 in a direction of arrow R1 and the motion of the wafer supply carrier 2 in a Z-axis direction as well as the attraction action of the supply hand 3, the wafer 1 is taken out of the supply carrier 2 and is rotationally displaced by the supply hand in a direction of $\theta 1$ about an axis O1 and, finally, the wafer is placed on and held, by attraction, by the orientation flat detecting table 4. On this table, the orientation flat detecting operation for aligning a notch 8 (called an "orientation flat") of the wafer in a predetermined direction, is executed. The orientation flat detection may be made by using such an arrangement as disclosed in Japanese Laid-Open Patent Application Sho 63-70436. However, details of this do not directly pertain to the present invention and, therefore, description thereof will be omitted here.

After the orientation flat detection, the wafer 1' is conveyed again by the supply hand 3, but now to the wafer stage 5 from the orientation flat detecting table 4, and the wafer is held thereon by attraction (Step S7). Subsequently, the relative position of each shot area on the wafer to the mask is adjusted (i.e. alignment) while, on the other hand, for each shot area, the shutter is opened to allow lithographic transfer of a pattern of the mask to the shot area, whereby the step-and-repeat exposures of the wafer are performed (Step S8). Subsequently, from the main CPU 21, an instruction signal is supplied to the conveying system 29 and the exposed wafer is collected. More specifically, the collecting hand 6 is rotationally moved in a direction $\theta 2$ about an axis O2 to receive the wafer from the wafer stage 5 and, then, the collecting hand 6 is again rotationally moved to be opposed to the wafer collection carrier 7. Thereafter, by means of the motion of the collecting hand 6 in a direction of an arrow R2, as well as by the motion of the collection carrier 7 in the Z-axis direction, the wafer is inserted into the collection carrier (Step S9). By the above, the exposure of one wafer is completed. Subsequently, whether exposures of all the wafers in one lot are completed or not, is checked (Step S10). If there are any unexposed wafers, Steps S7–S10 are repeated to complete exposures of the wafers in the one lot. If the exposures for the one lot are completed (Step S10), the sequence returns to the stand-by state (Step S6).

The operation described alone is the general type of operation normally made in the exposure apparatus. Actually, however, in order to increase the throughput of the apparatus to be as large as possible, the supplying hand 3, immediately after it conveys a wafer from the orientation flat detecting table 4 to the wafer stage 5, operates to take the next wafer out of the wafer supply carrier 2 and to convey the same to the orientation flat detecting table 4. Then, the hand 3 stands by, waiting for execution of the orientation flat detection and completion of the step-and-repeat exposure at Step S8. Promptly after the collecting hand 6 unloads an exposed wafer from the wafer stage 5, the supplying hand 3 conveys the wafer, with which the orientation flat detection has just been completed, from the orientation flat detecting table 4 to the wafer stage 5, whereby Step S8 starts. Accordingly, Steps S7–S9 are executed with partial overlapping, and there is a possibility that any vibration of the conveying system as it operates is transmitted through a frame to the wafer stage or the mask stage, resulting in an alignment error or unsatisfactory exposure.

Referring now to FIGS. 4–7, an embodiment of the present invention which can solve the above problem will be explained.

Figure 4:
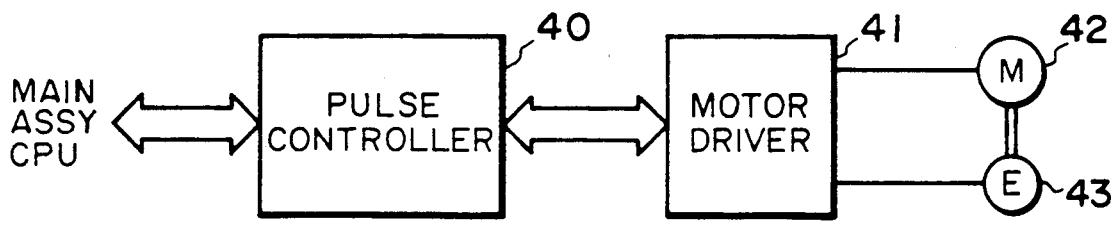
FIG. 4 is a block diagram of a major part of a driving device included in a conveying system of the exposure apparatus.

FIG. 4 is a block diagram of a major part of one driving device included in the conveying system 29, which driving device corresponds to the driving device in FIG. 1 for rotationally moving the supplying hand 3 in the direction $\theta 1$. In FIG. 4, denoted at 40 is a pulse controller in which those parameters (such as maximum driving speed, acceleration and deceleration rate, and the like) necessary for the control of the motor 42 by the main CPU 21, can be set. Also, in response to an instruction supplied from the main CPU 21, the pulse controller 40 supplies pulses to the motor driver 41, designating the amount and direction of rotation. Further, the pulse controller is equipped with a status register which gives indication to the main CPU 21 of the state of control of the motor 42. Encoder 43 produces pulses which are used to feed back the motion of the motor 42 to the motor driver 41.

Figure 5:
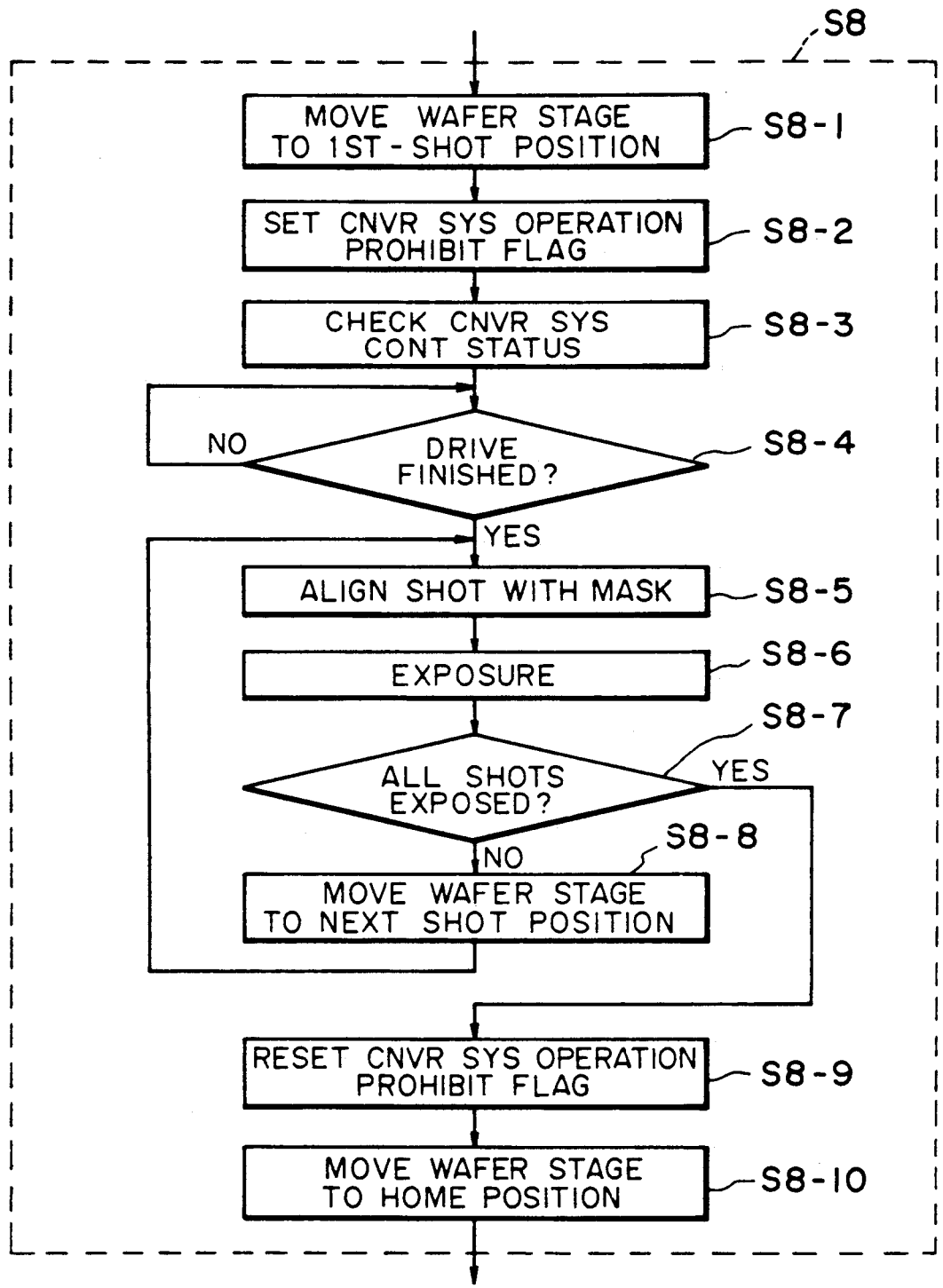
FIG. 5 is a flow chart illustrating a major part of a step-and-repeat exposure operation to be made in accordance with one embodiment of the present invention.
Figure 6:
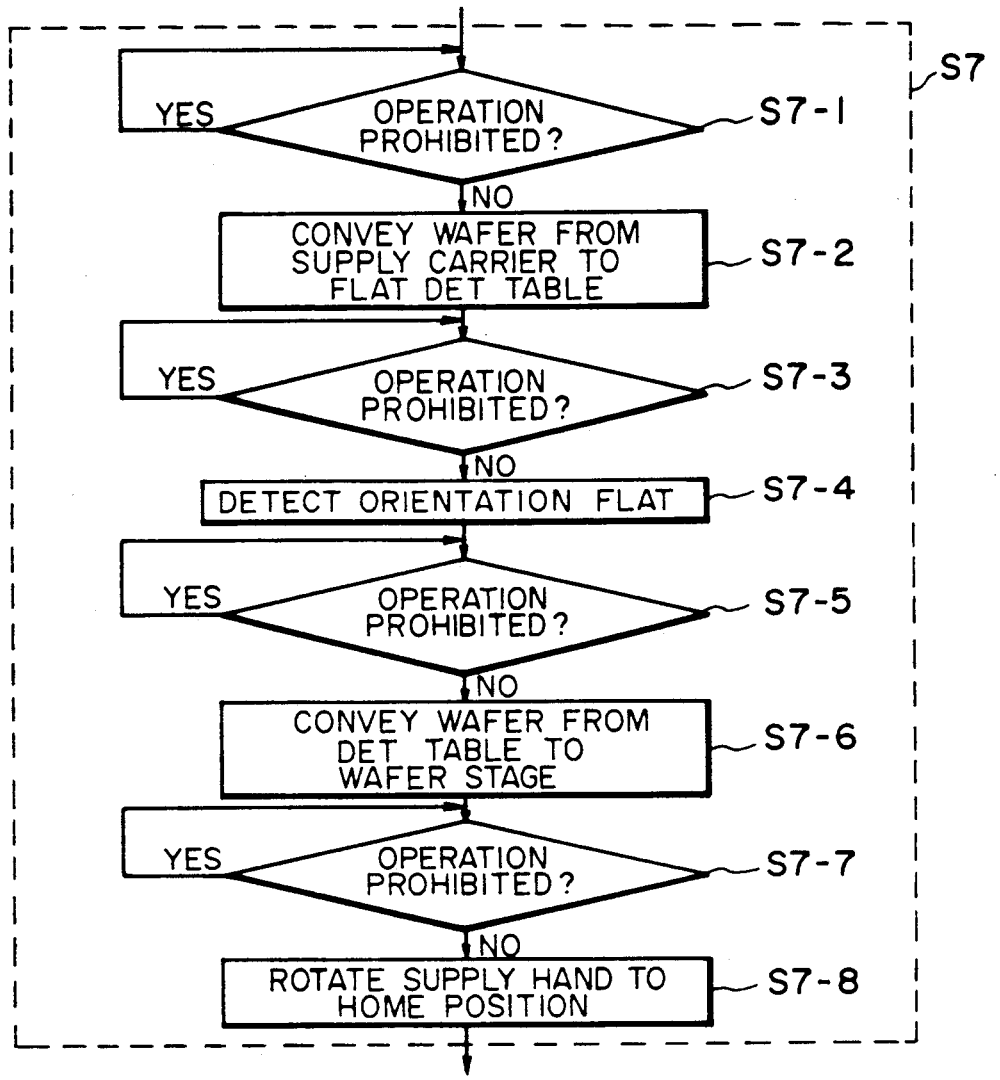
FIG. 6 is a flow chart illustrating a major part of wafer supply.
Figure 7:
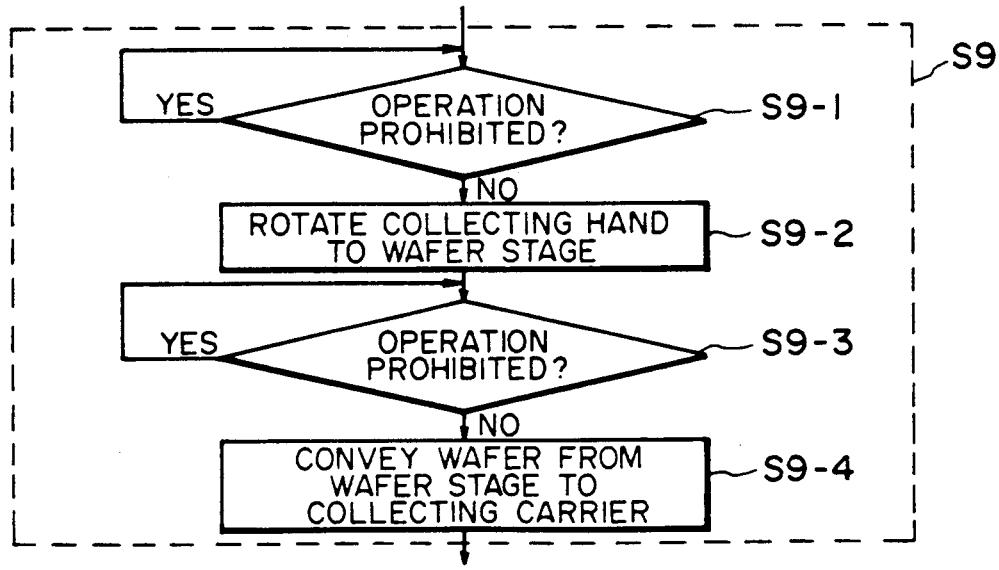
FIG. 7 is a flow chart illustrating a major part of wafer collection.

FIGS. 5–7 are flow charts related to the embodiment of the present invention, the illustrated flows corresponding to the contents of steps S7–S9 in FIG. 3.

Referring to these drawings, the flow of operation at Step S6 in FIG. 3 and those steps following it, will be explained. When, at Step S6, a start instruction is supplied from the console unit 30 to the main CPU 21, the main CPU 21 produces and applies an instruction to the conveying system 29 to cause the same to supply a wafer 1 to the wafer stage 5 (Step S7). In Step S7, as illustrated in FIG. 6, first, discrimination is made as to whether the operation of the conveying system is prohibited or not (Step S7-1). This discrimination is made by checking the state of the "conveying system operation prohibiting flag" which can be set and reset at Step S8 (FIG. 5). If, at this moment, the operation of Step S8 has not yet been executed (like a case of the first wafer), this operation prohibiting flag is being left reset as a result of the initialization at Step S1. Accordingly, the discrimination at Step S7-1 is passed with "NO", and Step S7-2 is executed. Namely, by means of the supplying hand 3, the wafer 1 is taken out of the wafer supply carrier 2, and it is conveyed to and placed on the orientation flat detecting table 4. Subsequently, the operation prohibiting flag is checked again (Step S7-3). Similarly, this discrimination is passed with "NO", and the subsequent step is executed. This is also the case of the discrimination to be made at each of Step S7-5 and Step S7-7, each discrimination being passed with "NO". Accordingly, the orientation flat detection is carried out (Step S7-4), and the supplying hand 3 conveys the wafer 1' from the orientation flat detecting table 4 to the wafer stage 5 (Step S7-6) and then, it returns back to its home position opposed to the supply carrier 2, as illustrated in FIG. 1 (Step S7-8). Actually, however, for a second wafer or wafers subsequent thereto, Steps S7-S9 are executed with overlapping. Therefore, if the operation prohibiting flag has been set (as will be described later) the sequence comes into a stand-by state and is kept in this state until the flag is reset. Accordingly, the operations of individual driving devices of the conveying system, including the supply hand, are prohibited.

Subsequently, the sequence goes to step-and-repeat exposure at Step S8 in FIG. 5. First, the wafer stage 5 is moved to such a position at which a first shot area of a wafer is opposed to the pattern of a mask (Step S8-1). Then, the operation inhibiting flag, for inhibiting the operation of the conveying system, is set (Step S8-2). Subsequently, with regard to each of the driving devices in the conveying system, a corresponding status register of a corresponding pulse controller 40 is checked, and the state of operation of each driving device is examined, (Step S8-3). Then, discrimination is made as to whether it is in the drive-finished state (Step S8-4). After all the driving devices of the conveying system come into the drive-finished state, this discrimination is passed with "YES". Thereafter, the mask-to-shot alignment is executed (Step S8-5) and the exposure is made (Step S8-6). Then, discrimination is made as to whether exposures of all the shot areas on the wafer are completed or not (Step S8-7). If there is any unexposed shot area, the wafer stage 5 is moved to the next shot position (Step S8-8). Thereafter, the operations from Step S8-5 to Step S8-8 are repeated until exposures of all the shot areas are completed. If this is completed, discrimination at Step S8-7 is passed with "YES" and the operation prohibiting flag is reset, whereby prohibition of the operation of respective driving devices in the conveying system is cancelled (Step S8-9). Then, the wafer stage 5 is moved back to its home position to allow the collecting hand 6 to receive the wafer (Step S8-10).

Subsequently, the sequence goes to Step S9 in FIG. 7. Similar to Step S7 in FIG. 6, first, whether the operation prohibiting flag is being set or not is checked (Step S9-1). If the operation prohibiting flag is not set, the discrimination is passed with "NO", and the collecting hand 6 is rotationally moved in a direction $\theta 2$, from the FIG. 1 position, so as to be opposed to the wafer stage 5 (Step S9-2). Subsequently, the operation prohibiting flag is checked again (Step S9-3) and, if the operation is not prohibited, the discrimination is passed with "NO". Then, the collecting hand 6 unloads a wafer from the wafer stage 5 and conveys the same to the wafer collection carrier 7, whereby it is accommodated in the carrier (Step S9-4).

Steps S7-S9 are executed in the manner described above and, for this reason, even if these steps are executed with partial overlapping, it is possible to avoid any alignment error or unsatisfactory exposure.

Figure 8:
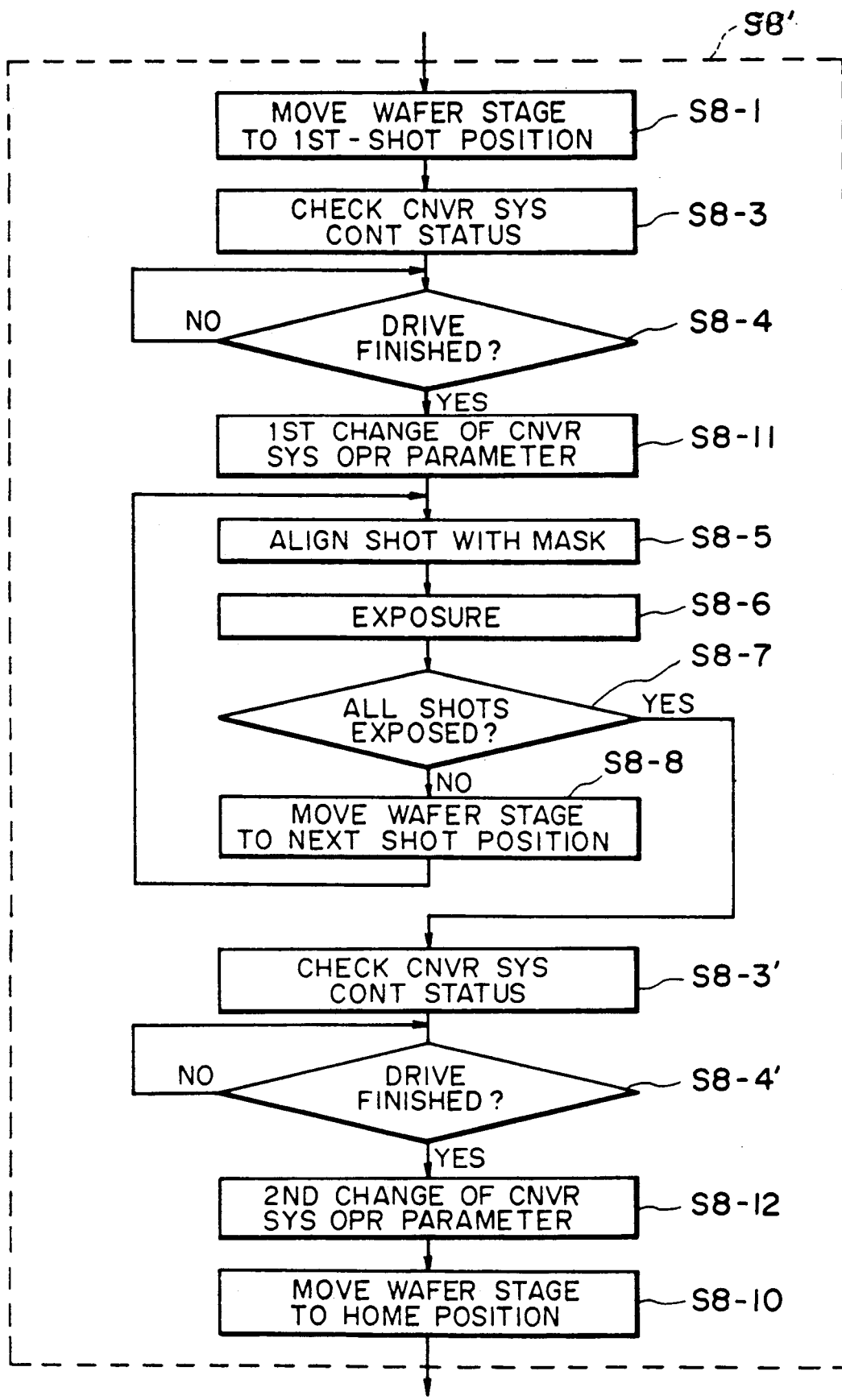
FIG. 8 is a flow chart illustrating a major part of a step-and-repeat exposure operation to be made in accordance with another embodiment of the present invention.
Figure 9:
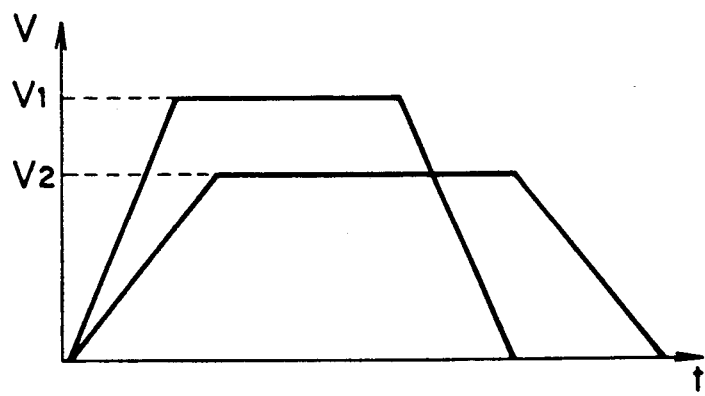
FIG. 9 is a graph of speed profile, showing an example of a driving pattern of a driving device included in a conveying system of an exposure apparatus according to an embodiment of the present invention.

Referring now to FIGS. 8 and 9, another embodiment of the present invention will be explained.

FIG. 8 corresponds Step S8 in FIG. 3, and shows the flow of step-and-repeat exposure. FIG. 9 is a graph of speed profile, illustrating acceleration/deceleration characteristics of one driving device in the conveying system 29. The axis of the abscissa denotes time, while the axis of the ordinate denotes speed.

At Step S8' in FIG. 8, first, the wafer stage 5 is moved to the first shot position (Step S8-1). Then, with regard to each driving device of the conveying system 29, the status of a corresponding pulse controller 40 (FIG. 4) is checked (Step S8-3), coming into a stand-by state, waiting for all the driving devices to be brought into the drive-finished state (Step S8-4). After this discrimination is passed with "YES", the setting of the operational parameter or parameters in each pulse controller is modified (Step S8-11). This modification is for reducing production of vibration during the operation of each driving device in the conveying system, by, for example, decreasing the maximum speed from V1 to V2 (as shown in FIG. 9) to thereby reduce the acceleration/deceleration rate. It is not necessary that the modification is made to all the driving devices of the conveying system at the same time after the operations of all the driving devices are finished. Rather, each time the status of drive-finish is discriminated with respect to one driving device, the modification may be made to the corresponding pulse controller of that driving device. The subsequent operations from Step S8-5 to S8-8 are the same as those in FIG. 5, and description thereof will be omitted here. If exposures of all the shot areas are completed, then with respect to each driving device of the conveying system 29, the status of a corresponding pulse controller is checked again (Step S8-3'), and discrimination is made as to whether the drive is finished or not (Step S8-4'). If the drive is finished, this discrimination is passed with "YES", and the setting of the operational parameter or parameters in each pulse controller is modified (Step S8-12). This modification is for cancelling the modification having been made at Step S8-11. (namely, for increasing the maximum speed from V2 to V1, to thereby enhance the acceleration/deceleration rate). The modification may be made in sequence to those of the pulse controllers with respect to which the drive finishing has been confirmed. Finally, the wafer stage 5 is moved back to its home position (Step S8-10).

As described in the foregoing, the driving parameter of a driving device in the conveying system 29 is modified at the time of alignment and exposure, to thereby suppress the production of vibration. As a result, it is possible to reduce the alignment error or unsatisfactory exposure. It is to be noted that, in this example, it is no longer necessary to check the operation prohibiting flag such as at Step S7 in FIG. 6 or at Step S9 in FIG. 7 (more particularly, at Steps S7-1, S7-3, S7-5, S7-7, S9-1 or S9-3).

Figure 10:
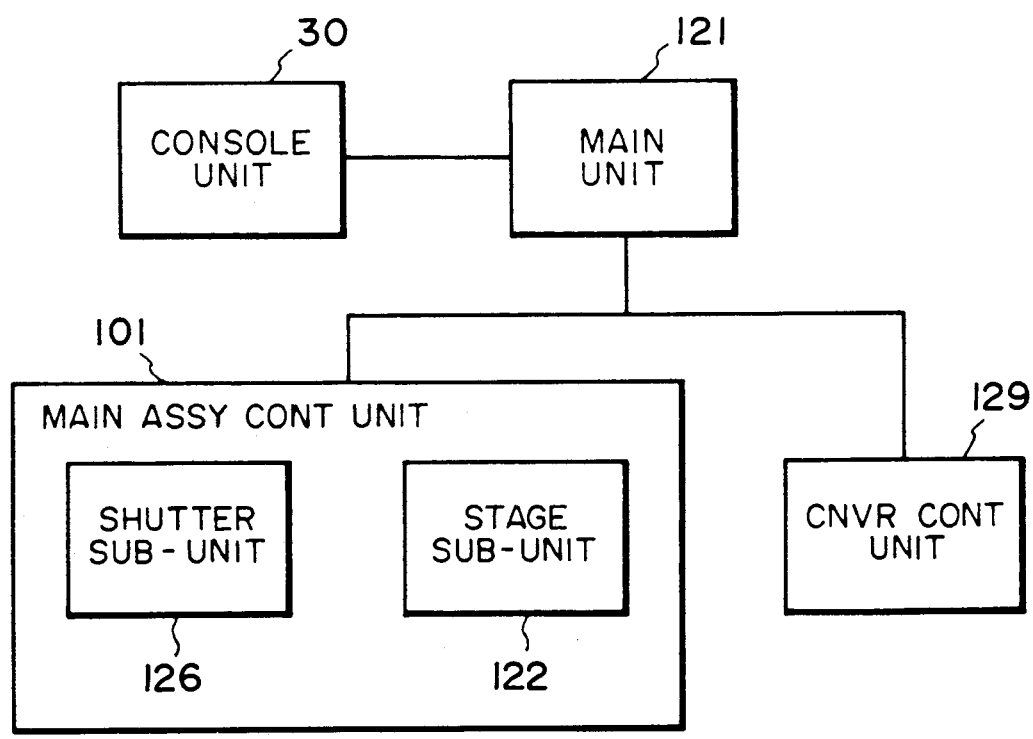
FIG. 10 is a block diagram of an electric circuit configuration of an exposure apparatus according to a further embodiment of the present invention.

FIG. 10 shows a further embodiment of the present invention. Like numerals are assigned to elements corresponding to or similar to, those in FIG. 2. In FIG. 10, a main assembly controlling unit 101 includes a stage sub-unit 122 and a shutter sub-unit 126. The stage sub-unit 122 includes an alignment detecting system, an illumination system and a focus detecting system and is adapted to control a wafer stage, a mask stage, and the like. Denoted at 121 is a main unit which is operable to control the exposure apparatus as a whole; and at 129 is a conveyance control unit which is adapted to control a wafer conveying system, for example. Each unit is equipped with a CPU. In the present embodiment, the operations illustrated in FIG. 3 are shared among the units described above. That is, Steps S2 and S3 are conducted under the influence of the console unit 30, Steps S4, S7 and S9 are conducted under the influence of the conveyance control unit 129, and Steps S5 and S8 are conducted under the influence of the main assembly control unit 101. The flow as a whole and the intercommunication between units are controlled by the main unit 121. Here, "main CPU" at Step S3 in FIG. 3 should read "main unit".

Figure 11A:
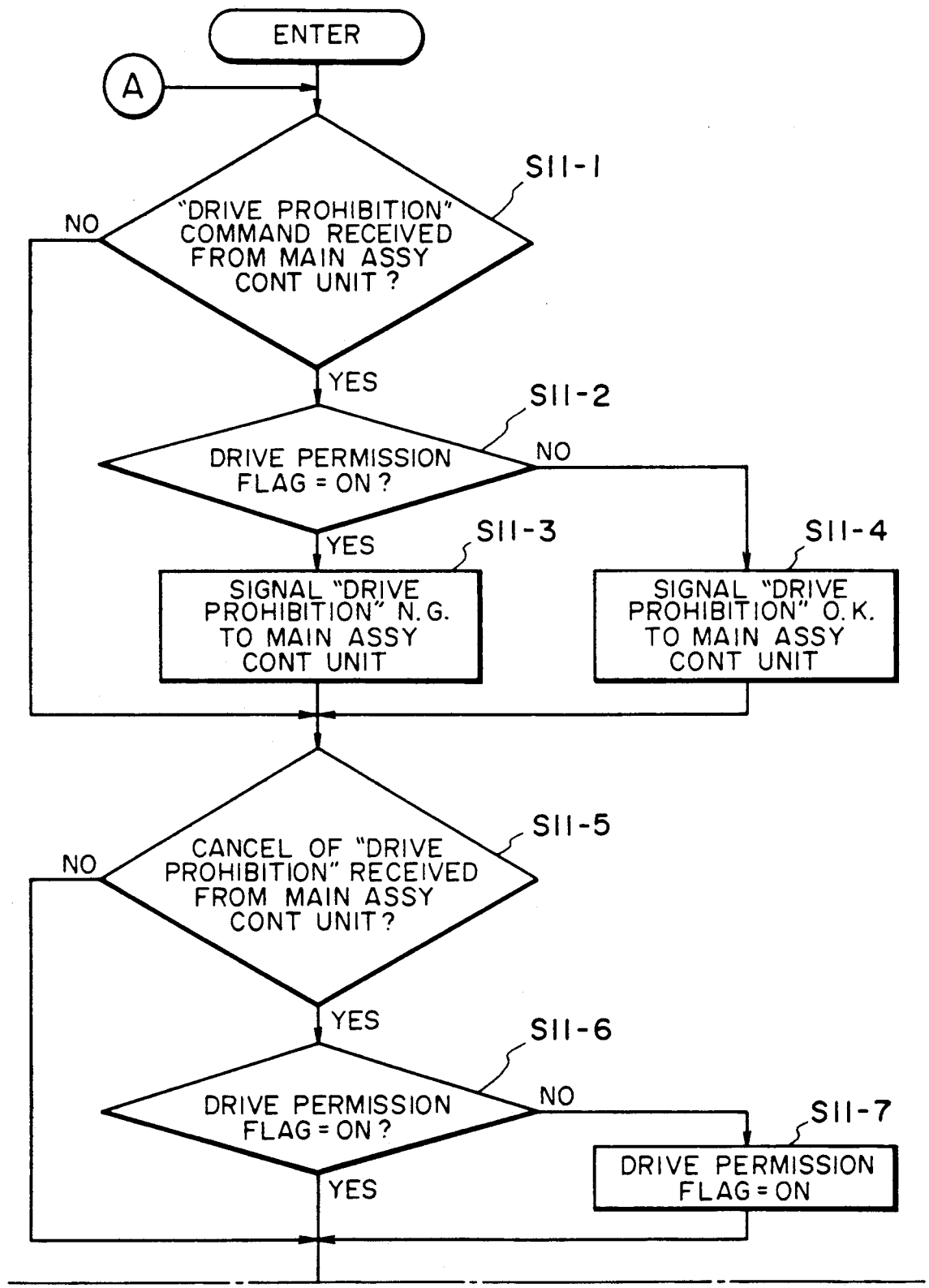
FIGS. 11, 11A, 11B are flow charts related to intercommunication between units, by a main unit of an exposure apparatus according to the FIG. 10 embodiment.
Figure 11B:
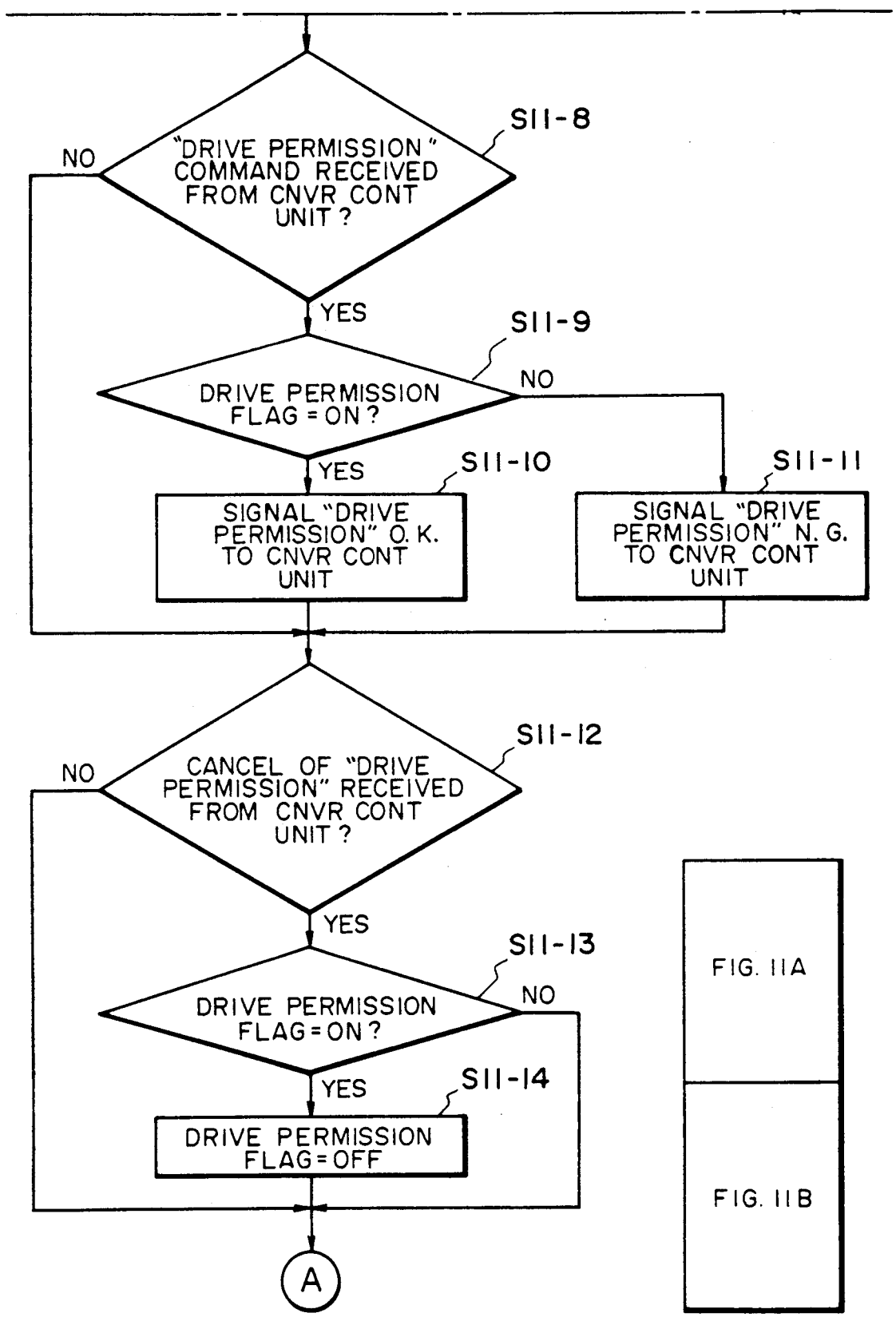
Figure 11:
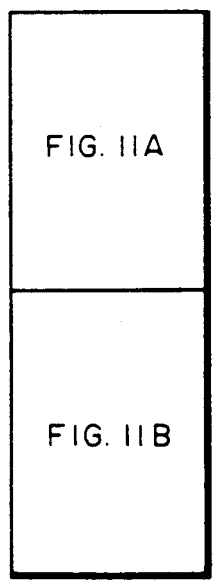
Figure 12:
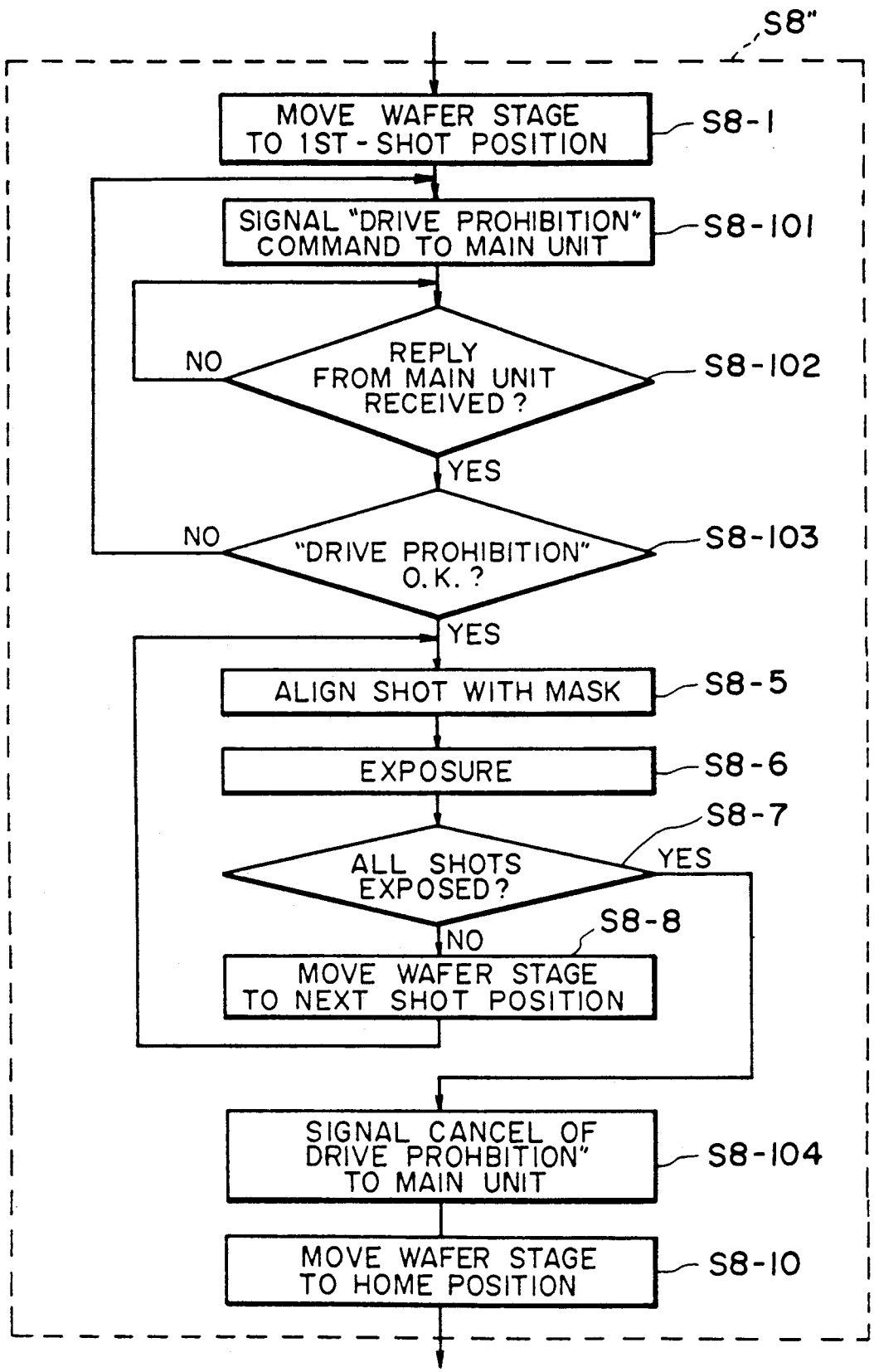
FIG. 12 is a flow chart illustrating a major part of a step-and-repeat exposure operation to be made in the FIG. 10 embodiment.
Figure 13A:
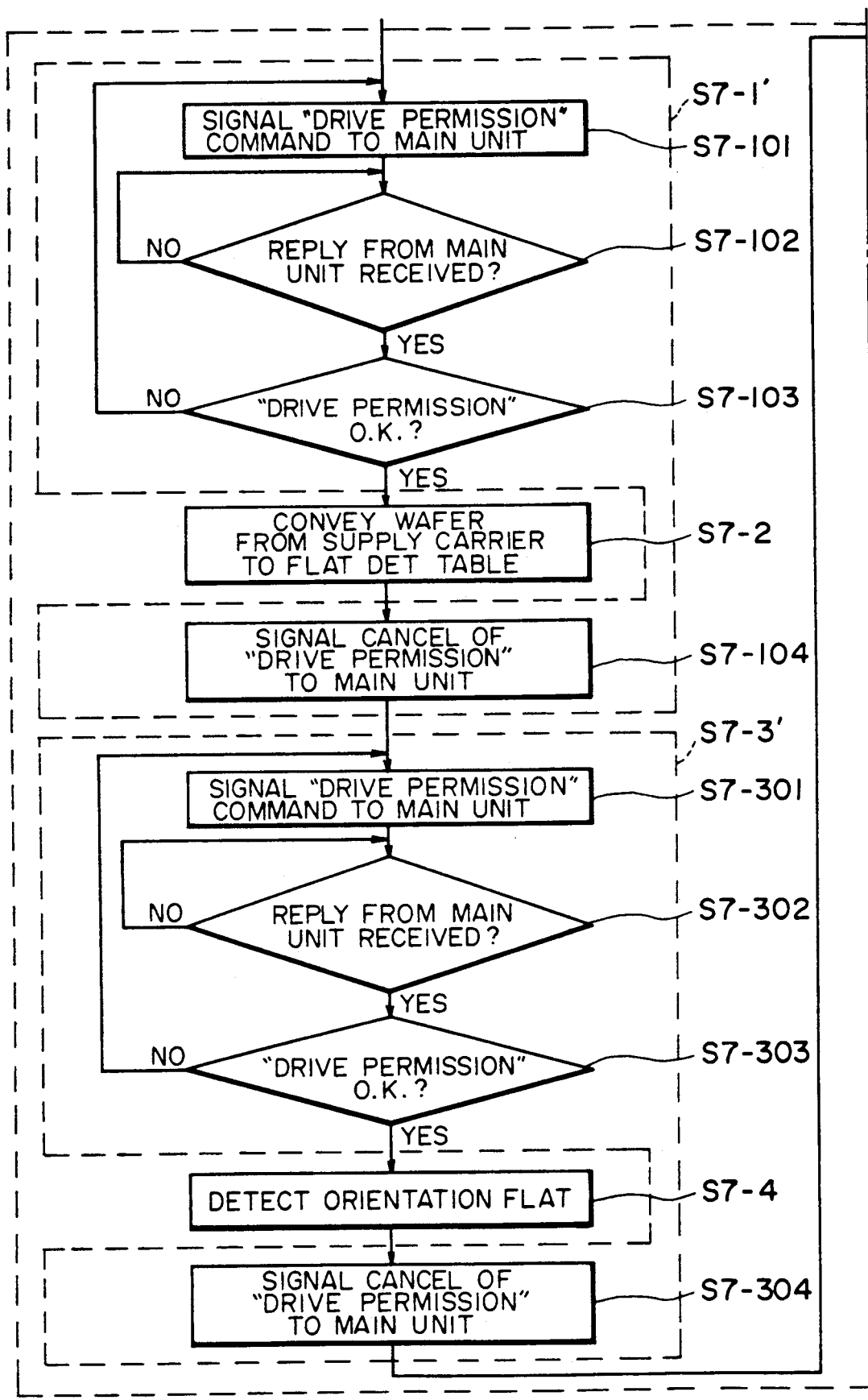
FIGS. 13, 13A, 13B are flow charts illustrating a major part of wafer supply, to be made in the FIG. 10 embodiment.
Figures 13, 13B:
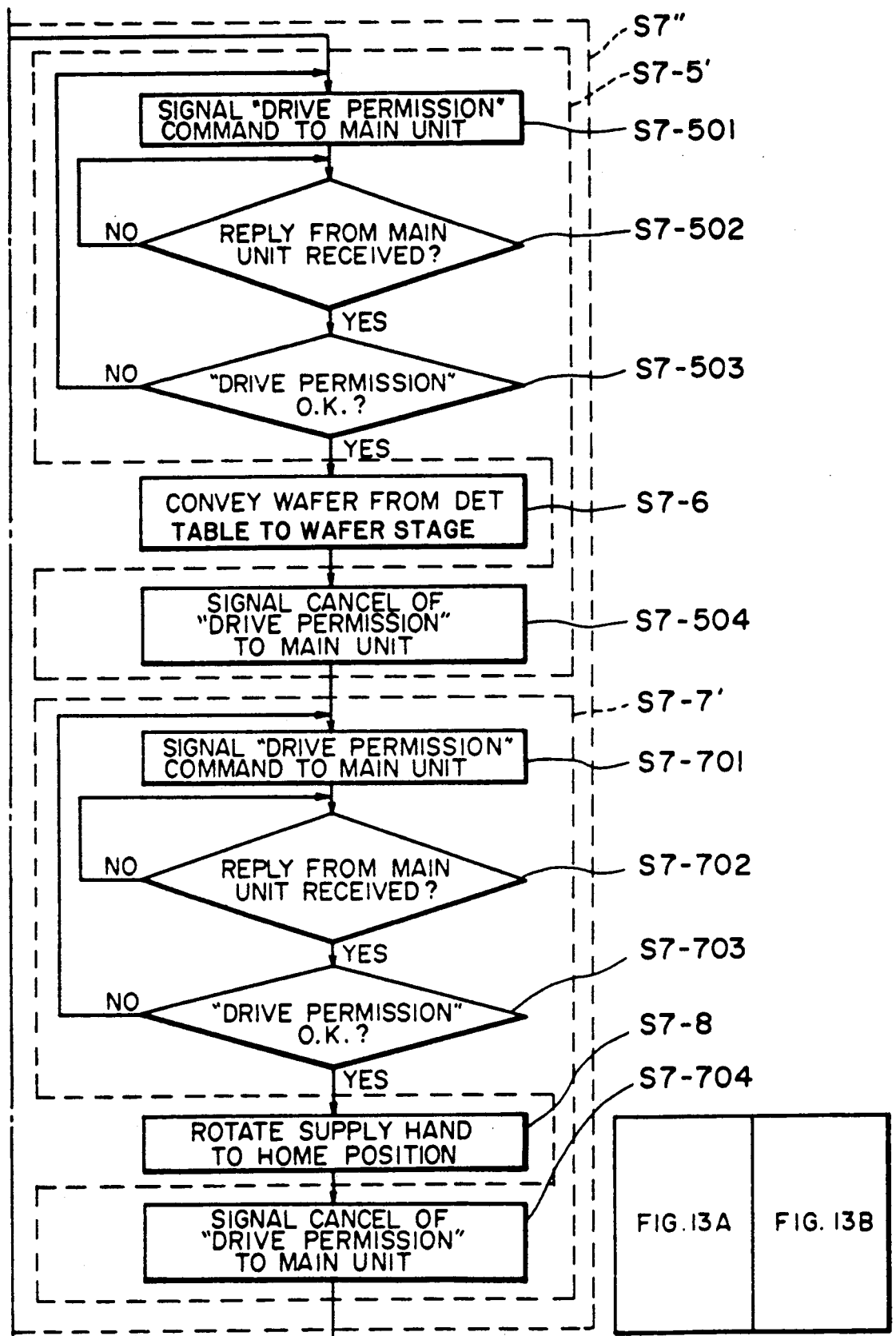
Figure 14:
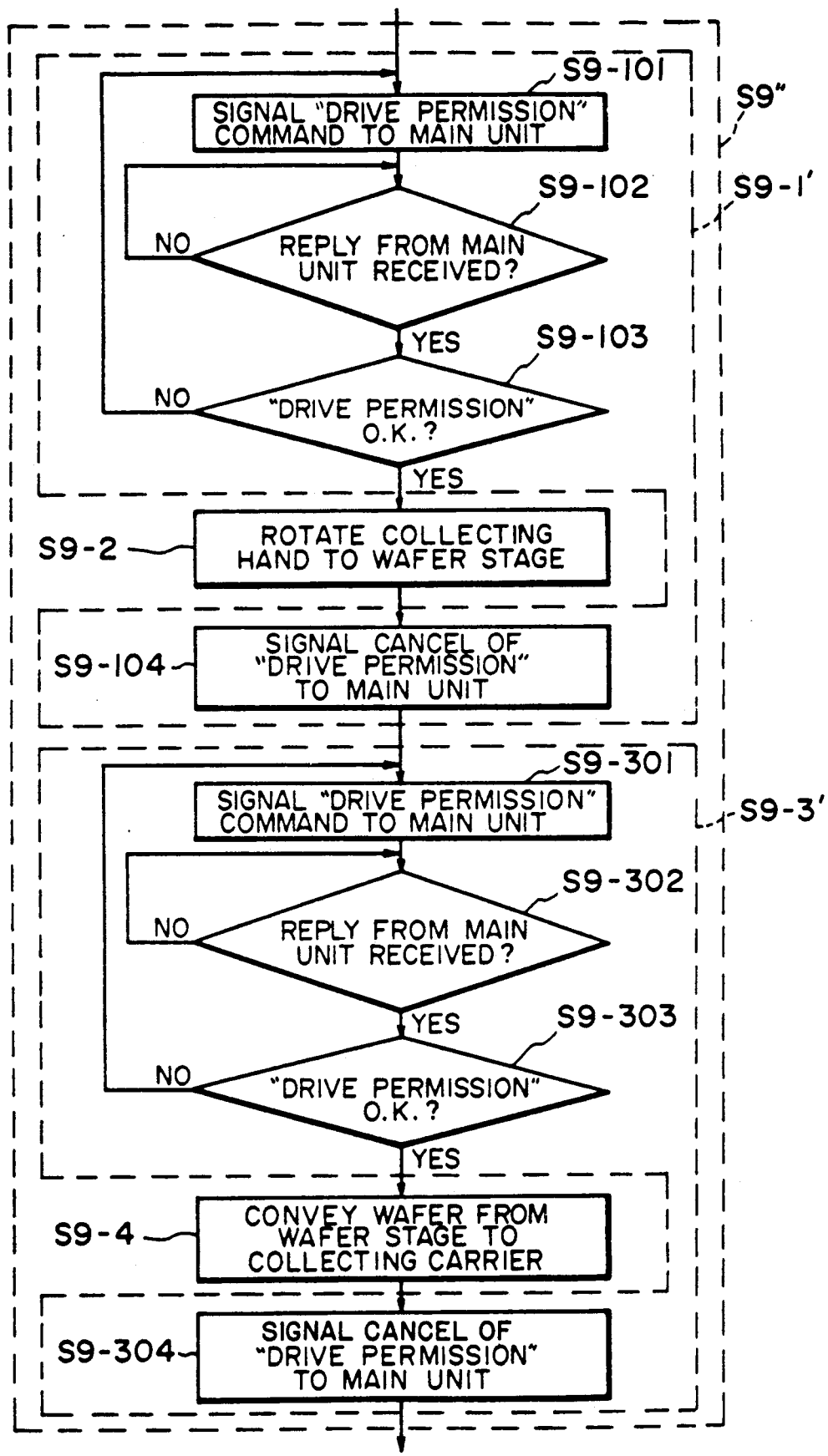
FIG. 14 is a flow chart illustrating a major part of wafer collection, to be made in the FIG. 10 embodiment.

Referring to FIGS. 11–14, features of the present embodiment as compared with the foregoing embodiments, will be explained. FIG. 11 is a flow chart related to the intercommunication between units, by the main unit 121. FIGS. 12–14 are flow charts corresponding to those in FIGS. 5–7, respectively.

First, Steps S8-101–S8-103 in FIG. 12 correspond to Steps S8-2–S8-4 in FIG. 5. More specifically, if any conveying device is being operated, the main assembly control unit 101 waits for the finish of the operation thereof and, when it is finished, main assembly control unit 101 signals to the main unit 121 a "drive prohibition" request, requesting prohibition of the drive of the conveying system (Step S8-101). Then, until a response from the main unit 121 is received, the discrimination at Step S8-102 is repeated.

In the main unit 121, in response to reception of the "drive prohibition" request from the main assembly control unit 101, discrimination at Step S11-1 is passed with "YES", and discrimination is made as to whether a drive permitting flag is set "ON" or not (Step S11-2). The drive permitting flag is one which indicates whether or not the drive of the conveying system is allowed or not. The drive permitting flag is controlled by the main unit 121, and it is set "ON" when the "drive prohibition" is cancelled by the main assembly control unit 101 while, on the other hand, it is set "OFF" when the "drive permission" is cancelled by the conveyance control unit, as will be described later. If it is discriminated at Step S11-2 that the drive permission flag is set "ON", then the discrimination is passed with "YES" and "drive prohibition N.G." is signaled to the main assembly control unit 101 (Step S11-3). If, on the other hand, the drive permitting flag is set "OFF", this discrimination is passed with "NO" so that "drive prohibition O.K." is signaled to the main assembly control unit 101 (Step S11-4).

When the main assembly control unit 101 receives a response from the main unit 121, discrimination at Step S8-102 is passed with "YES", and discrimination is made as to whether the "drive prohibition" is O.K. or not (Step S8-103). If not O.K., the discrimination is passed with "NO" and sequence goes back to S8-101, and a "drive prohibition" request is signaled again to the main unit 121. If the drive prohibition is O.K., the discrimination is passed with "YES", and the mask-to-shot alignment at Step S8-5 is performed.

Then, as described hereinbefore, the sequence of Steps S8-5–S8-8 is repeated until exposures of all the shot areas are completed. If the exposures are completed, discrimination at Step S8-7 is passed with "YES", and "drive prohibition" cancelling is signaled to the main unit 121 (Step S8-104). Then, Step S8-10 (movement of the wafer stage back to the home position) is executed, whereby a series of operations at Step S8" in FIG. 11 are completed.

In the main unit 121, in response to reception of the "drive prohibition" cancelling signal from the main assembly control unit 101, discrimination at Step S11-5 is passed with "YES", and discrimination is made as to whether the drive permitting flag is set "ON" or not (Step S11-6). If the drive permitting flag is set "ON", this discrimination is passed with "YES" and the sequence goes to the next step, Step S11-8. If the drive permitting flag is not set "ON", the discrimination is passed with "NO" and, after setting the drive permitting flag "ON" (Step S11-7), the sequence goes to Step S11-8.

The flow chart of FIG. 13 corresponds to the conveyance control operation in FIG. 6, and Steps S7-1, S7-3, S7-5 and S7-7 in FIG. 6 are replaced in FIG. 13 by steps S7-1', S7-3', S7-5' and S7-7'. That is, before execution of each conveying operation, an inquiry is made to the main unit 121 as to whether the drive is permitted or not. After completion of the conveying operation, corresponding information is supplied to the main unit.

More specifically, first, the conveying control unit 129 signals a "drive permission" request to the main unit 121 (Step S7-101). In the main unit 121, in response to this "drive permission" request, discrimination at Step S11-8 (FIG. 11) is passed with "YES", and discrimination is made as to whether the drive permitting flag is set "ON" or not (Step S11-9). If the drive permitting flag is set "ON", the discrimination is passed with "YES" and "drive permission O.K." is signaled to the conveyance control unit 129 (Step S11-10). If the drive permitting flag is set "OFF", that discrimination is passed with "NO" and "drive permission N.G." is signaled to the conveyance control unit 129 (Step S11-11). When the conveyance control unit 129 receives a response from the main unit 121, discrimination at Step S7-102 is passed with "YES", and discrimination is made as to whether the "drive permission" is O.K. or not (Step S7-103). If the "drive permission" is N.G., the discrimination is passed with "NO" and the sequence goes back to Step S7-101, and a "drive permission" request is signaled again to the main unit 121. If the "drive permission" is O.K., the discrimination is passed with "YES" and Step S7-2 (conveyance of the wafer from the supply carrier to the orientation flat detecting table) is executed. After this conveying operation is finished, "drive permission" cancelling is signaled to the main unit 121 (Step S7-104). In response to reception of the "drive permission" cancelling from the conveyance control unit 129, in the main unit 121, the discrimination at Step S11-12 is passed with "YES" and, then, discrimination is made as to whether the drive permitting flag is set "ON" or not (Step S11-13). If the drive permitting flag is set "ON", the discrimination is passed with "YES" and the drive permitting flag is set "OFF" (Step S11-14). On the other hand, if the drive permitting flag is not set "ON" (Step S11-13), the discrimination is passed with "NO", and the sequence goes to the next step, Step S11-1, in this case.

Steps S7-4, S7-6 and S7-8 are executed in a similar way, and a series of operations at Step S7' in FIG. 13 are completed.

The flow chart of FIG. 14 corresponds to the conveyance control operation in FIG. 7, and Steps S9-1 and S9-3 in FIG. 7 are replaced in FIG. 14 by Steps S9-1' and S9-3'. The sequence of operation is the same as that of the FIG. 13, and description thereof will be omitted here.

It is to be noted that, while with reference to FIG. 11 the main unit 121 has been described only with respect to its function related to the communication of information concerning the drive of the conveying system, as a matter of course, the main unit 121 has an additional function related to the communication of other information.

As described hereinbefore, even on an occasion when the exposure apparatus comprises a plurality of units, if some flags, such as the drive permitting flag as described above, are prepared, then it becomes easier to separate the alignment or exposure operation from any other operation that adversely affects the alignment or exposure operation. Therefore, it is possible to avoid an alignment error or unsatisfactory exposure.

Further, in the case of the FIG. 8 embodiment, a "conveying system operational parameter flag" or the like may be prepared in the main unit. By providing a function of making mutual reference between the main assembly control unit and the conveyance control unit, substantially the same advantageous effects are obtainable.

In accordance with the present invention, as has hitherto been described, in an exposure apparatus for lithographically transferring a pattern of an original to a radiation-sensitive workpiece by using a radiation beam, at the time of alignment or exposure of the original and the workpiece, the operation of such a driving device that does not participate in the alignment or exposure is prohibited or, alternatively, the servo characteristic of that driving device is modified, so as to prevent production or transmission of mechanical external force to the original and the workpiece. This provides an advantageous effect of enhancement of the alignment precision and reduction of defective chips, and as a consequence, of the enhancement of yield of semiconductor devices.

Further, there is an advantage of reducing the burden on the mechanical designing for vibration prevention, as by using high-rigidity materials or a high-rigidity structure effective to suppress the vibration.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for printing, on a workpiece, a pattern formed on an original, said apparatus comprising:
exposure means for aligning the original and the workpiece, and/or for exposing the workpiece to the original with radiation energy;
driving means having no participation in the aligning operation and/or in the exposure operation of said exposure means; and
control means comprising means for determining whether the exposure means is performing the aligning and/or the exposure operation, said control means further comprising means for prohibiting the operation of said driving means on the basis of the determination when said exposure means performs the aligning operation and/or the exposure operation.

2. An apparatus according to claim 1, wherein said exposure means comprises means for conducting step-and-repeat exposure of the workpiece.

3. An apparatus according to claim 2, wherein said driving means comprises means for conveying the workpiece to an exposure position from a position at which the workpiece can be stored.

4. An exposure apparatus for printing, on a workpiece, a pattern formed on an original, said apparatus comprising:
exposure means comprising a stage for supporting the workpiece at an exposure station at which the pattern of the original is printed on the workpiece, said exposure means further comprising means for aligning the original and the workpiece, and/or means for exposing the workpiece to the original with radiation energy;
servo driving means for feeding the workpiece onto said stage, said servo driving means having no participation in the aligning operation and/or in the exposing operation of said exposure means; and
control means for changing a servo characteristic of said servo driving means, between a time when said exposure means performs the aligning operation and/or the exposure operation and a time when said exposure means does not perform the aligning operation or the exposure operation.

5. An exposure apparatus for printing, on a workpiece, a pattern formed on an original, said apparatus comprising:
exposure means for aligning the original and the workpiece, and/or for exposing the workpiece to the original with radiation energy;
servo driving means having no participation in the aligning operation and/or in the exposure operation of said exposure means; and
control means for changing a servo characteristic of said servo driving means, between a time when said exposure means performs the aligning operation and/or the exposure operation and a time when said exposure means does not perform the aligning operation or the exposure operation,
wherein said control means changes the servo characteristic, when said exposure means performs the aligning operation and/or the exposure operation, so that vibration caused by said servo driving means is attenuated.

6. An exposure apparatus for printing, on a workpiece, a pattern formed on an original, said apparatus comprising:
exposure means for aligning the original and the workpiece, and/or for exposing the workpiece to the original with radiation energy;
servo driving means having no participation in the aligning operation and/or in the exposure operation of said exposure means; and control means for changing a servo characteristic of said servo driving means, between a time when said exposure means performs the aligning operation and/or the exposure operation and a time when said exposure means does not perform the aligning operation or the exposure operation, wherein the workpiece comprises a semiconductor wafer and said servo driving means comprises a wafer supplying hand and a wafer collecting hand, said wafer supplying hand comprising means for conveying the wafer from a water supply station to an orientation flat detecting station and means for conveying the wafer from said orientation flat detecting station to a wafer stage of said exposure means, and said wafer collecting hand comprises means for conveying the wafer from said wafer stage to a wafer collecting station.

7. An apparatus according to claim 4, wherein said exposure means comprises means for executing step-and-repeat exposure of the workpiece.

8. A method of controlling an exposure apparatus for printing, on a workpiece, a pattern formed on an original, said method comprising the steps of:

performing aligning of the original and the workpiece, and/or exposure of the workpiece to the original with radiation energy by exposure means;

determining whether the exposure means is performing the aligning and/or the exposure operation in said performing step; and prohibiting operation of driving means having no participation in the aligning operation and/or in the exposure operation of the exposure means, on the basis of the determination made in said determining step when the exposure means performs the aligning operation and/or the exposure operation.

9. A method of controlling an exposure apparatus for printing, on a workpiece, a pattern formed on an original, said method comprising the steps of:

aligning the original and the workpiece, and/or exposing the workpiece to the original with radiation energy; and changing a servo characteristic of servo driving means having no participation in the aligning operation or in the exposure operation of exposure means, when the exposure means performs the aligning operation or the exposure operation.

* * * * *

UNITED STATES PATENT AND TRADEMARK OFFICE
CERTIFICATE OF CORRECTION

PATENT NO. : 5,008,703
DATED : April 16, 1991
INVENTOR(S) : Eigo Kawakami et al.

It is certified that error appears in the above-identified patent and that said Letters Patent is hereby corrected as shown below:

On the title page:

Immediately above the Abstract, insert:
    --Attorney, Agent or Firm—Fitzpatrick, Cella, Harper & Scinto--.

COLUMN 4

Line 18, "alone" should read --above--.

COLUMN 11

Line 11, "water supply station" should read --wafer supply station--.

Signed and Sealed this

Twentieth Day of October, 1992

Attest:

DOUGLAS B. COMER

Attesting Officer    Acting Commissioner of Patents and Trademarks